United States Patent [19]

Bashir et al.

[11] Patent Number: 5,411,913
[45] Date of Patent: May 2, 1995

[54] SIMPLE PLANARIZED TRENCH ISOLATION AND FIELD OXIDE FORMATION USING POLY-SILICON

[75] Inventors: Rashid Bashir, Santa Clara; Francois Hebert, Sunnyvale; Datong Chen, Fremont, all of Calif.

[73] Assignee: National Semiconductor Corporation, Santa Clara, Calif.

[21] Appl. No.: 236,387

[22] Filed: Apr. 29, 1994

[51] Int. Cl.⁶ .................. H01L 21/311; H01L 21/76
[52] U.S. Cl. ................... 437/67; 437/924; 437/984
[58] Field of Search ............ 437/64, 67, 924, 984, 437/228; 148/141

[56] References Cited

U.S. PATENT DOCUMENTS

| Re. 34,400 | 11/1993 | Goto et al. | 437/67 |
| 4,879,254 | 11/1989 | Tzuzuki et al. | 437/228 |
| 5,294,296 | 3/1994 | Yoon et al. | 437/228 |

FOREIGN PATENT DOCUMENTS 61-67932  4/1986  Japan.
1217964  8/1989  Japan.

OTHER PUBLICATIONS

Kurosawa et al., *A New Bird's-Beak Free Field Isolation Technology for VLSI Devices*, International Electron Devices Meeting, Dig. Tech, Paper, pp. 384–387 (1981).
Rung et al., *Deep Trench Isolated CMOS Devices*, International Electron Devices meeting, Digest Technical Paper, pp. 237–240 (1982).
Katsumata et al., *Sub-20 ps ECL Bipolar Technology with High Breakdown Voltage*, ESSDERC, pp. 133–136 (Sep. 1993).
Lutze et al., *Electrical Limitations of Advanced LOCOS Isolation for Deep Submicrometer CMOS*, IEEE Transactions on Electron Devices, vol. 38, No. 2, pp. 242–245 (Feb., 1991).
Poon et al., *A Trench Isolation Process for BiCMOS Circuits*, IEE Bipolar Circuits and Technology Meeting 3.3, pp. 45–48 (1993).

*Primary Examiner*—George Fourson
*Assistant Examiner*—Thomas G. Bilodeau
*Attorney, Agent, or Firm*—Limbach & Limbach; Donald H. Nelson; Vincenzo D. Pitruzzella

[57] ABSTRACT

A device isolation scheme that is particularly suited to the fabrication of high density, high performance CMOS, bipolar, or BiCMOS devices, and overcomes many of the problems associated with existing isolation methods. Photolithographic techniques are used to define active regions on a substrate. Using the photoresist as a mask for the active regions, the silicon in the inactive regions is etched. A pad oxide layer and nitride layer are then formed on the substrate. A layer of oxide is then deposited and photolithographic techniques are again used to define the locations for desired trench structures. After removal of the remaining photoresist, deep trenches are etched in the silicon substrate. An oxidation step is then carried out to provide a layer of oxide lining the trenches, followed by deposition of a layer of poly-silicon over the substrate, filling the trenches. The poly-silicon layer is etched back, removing it from the tops of the trenches and the field regions, and leaving a poly-silicon spacer on the sides of those portions of the previously deposited oxide layer which cover the active regions. The spacers are used to align a photoresist mask which is used to etch away the oxide layer on top of the active regions. The spacers are then removed while keeping the photoresist mask intact, thereby protecting the poly-silicon on top of the trenches. The photoresist mask is then removed and the poly-silicon on top of each trench is oxidized to cap the trench. The result is a highly planar surface in which active regions are separated by field oxide or poly-silicon filled trenches.

21 Claims, 3 Drawing Sheets

SIMPLE PLANARIZED TRENCH ISOLATION AND FIELD OXIDE FORMATION USING POLY-SILICON

FIELD OF THE INVENTION

The present invention relates to an isolation process used to separate active device regions in integrated circuits. The process produces a highly planarized surface and is particularly suitable for use in the fabrication of high density and high performance CMOS, bipolar, or BiCMOS devices.

BACKGROUND OF THE INVENTION

Integrated circuits are produced by means of a fabrication process which converts a circuit design into an operable device. The fabrication process consists of a sequence of steps which transforms a substrate of semiconductor material, typically silicon, into a device with multiple layers, each having a specific pattern of structures and interconnections. A finished integrated circuit is usually comprised of a multitude of smaller devices which are electrically connected in a desired manner.

In order for an integrated circuit to properly operate, it is necessary that the component devices initially be electrically isolated from each other. The devices can then be connected by means of standard interconnection techniques. Isolation techniques are thus a critical part of the fabrication process, because without them, properly functioning complex integrated circuits could not be constructed.

The importance of device isolation to the fabrication of integrated circuits has lead to the development of a variety of processes which are designed to achieve that goal. A variety of isolation processes are required because different types of integrated circuits (e.g., NMOS, CMOS, bipolar) have differing electrical and structural characteristics, and this can affect the type of structure required for effective isolation. The isolation techniques vary in such attributes as minimum isolation spacing (the minimum separation required to isolate structures), planarity of the final surface (which impacts the ease with which later fabrication steps can be carded out), complexity of the isolation process, and the density of defects created during the process.

One of the most common isolation methods involves the formation of field oxide regions. One of the most basic methods of forming field oxide regions is termed the direct isolation technique. This involves the formation of an oxide layer in the inactive or field regions of the substrate on which the devices are fabricated. The oxide is grown as a continuous film which is selectively removed from the active regions by means of photolithographic techniques. This isolation process is used for MOS integrated circuits and is designed to prevent the formation of channels in the field oxide regions between individual devices, where such channels would serve to electrically connect the devices.

In the direct isolation process the entire isolation oxide is grown above the surface of the silicon substrate. This produces a highly non-planar surface after the oxide is removed from the active regions. For this reason, several variants of the direct isolation technique have been developed. These variants include the fully recessed isolation oxide process (which involves etching trenches into the substrate to a sufficient depth so that the final oxide layer is level with the surface of the substrate) and the semi-recessed local oxidation of silicon (LOCOS) isolation process.

One problem with the use of field oxide isolation methods is the formation of "bird's beak" or "bird's head" structures. The "bird's beak" structure results from lateral oxidation under the nitride masks used in the standard LOCOS procedure. The "bird's head" formation results from lateral oxidation under the nitride masks used in recessed or etch back LOCOS procedures. The walls of the recessed portions of the substrate adjacent to the nitride masks, which are a feature of these procedures, greatly facilitate the lateral oxidation. These formations ("bird's beak" and "bird's head") encroach upon the active device area, thereby requiring greater isolation distances between active device regions to compensate for this encroachment and resulting in a considerable reduction of the packing density of the devices. Various methods have been proposed to overcome the limits on packing density imposed by the use of field oxide isolation methods. One such method, referred to as "BOX", has been proposed by Kurosawa et al. in "A New Bird's-Beak Free Field Isolation Technology for VLSI Devices", International Electron Devices Meeting, Dig. Tech. Paper, pp. 384–387 (1981). The name "BOX" has been given to this method because it involves burying oxide into etched grooves formed in silicon substrates. According to this method, the silicon substrate is etched in the field region using reactive ion etching (RIE), leaving a layer of aluminum coveting the active device areas. Silicon dioxide ($SiO_2$) is then plasma deposited over the entire substrate. The silicon dioxide fills up the portion of the substrate previously etched away and also covers the aluminum layer.

The plasma deposited silicon dioxide is then subjected to a lift-off technique using a buffered HF solution. This leaves V-shaped grooves in the periphery of the active region. The silicon dioxide on top of the aluminum mask is lifted off by an etch step. The remaining V-shaped grooves are then buried under silicon dioxide in a second step. This is accomplished by chemical vapor deposition (CVD) of silicon dioxide, followed by a planarization step using a spin-coated resist. The resist and silicon dioxide layers are simultaneously etched by RIE. The oxide surfaces are then smoothed and any oxide remaining on the active device region is removed by solution etching.

A drawback to the use of the BOX method is that it is very complex and cannot always be performed efficiently and reliably. First of all, a two step oxide burying technique is needed, which is more time consuming than a single oxide deposition step. Furthermore, resist planarization and resist etch back steps are involved, which are difficult to control to close tolerances in a manufacturing environment. In addition, resist planarization and etch-back techniques are not as effective and are difficult to properly implement for devices having large active regions, i.e., global planarity is difficult to achieve.

Another type of isolation process which has been developed to separate individual active device regions on a semiconductor substrate is termed the "trench etch and refill" technique. This method is based on the fabrication of shallow or deep trench structures in the substrate, with the trenches then being filled with an insulator. The technique has been used in the fabrication of several types of devices: the replacement of the LOCOS (local oxidation of silicon) technique for devices having the same channel type within the same tub in CMOS devices, for isolation of bipolar devices, for isolation of n-channel from p-channel devices and to prevent latchup in CMOS, for use as trench-capacitor structures in dynamic random access memory devices (DRAMs), and for use in load resistor structures in static random access memory devices (SRAMS).

An example of a trench isolation method is disclosed in a publication by Rung et al. entitled, "Deep Trench Isolated CMOS Devices", International Electron Devices Meeting, Digest Technical Paper, pp. 237–240 (1982). According to this method, trenches are formed by RIE and are then filled with silicon dioxide or poly-silicon which are deposited by using low pressure chemical vapor deposition (LPCVD). Once the trenches are filled, a critical etch back step must be accomplished using end point detection. After the etch back step, a capping oxidation step is performed using a nitride layer as an oxidation mask. This isolation method is somewhat complicated as it uses a trench masking oxide layer to define the trench locations and another oxide layer for the purpose of forming the field oxide regions.

Yet another isolation method is disclosed by Katsumata et al. in "Sub-20 ps ECL Bipolar Technology with High Breakdown Voltage", ESSDERC (September 1993). In this paper, the authors disclose a shallow and deep trench isolation method using Low-Temperature Oxide Filling. According to this method, shallow and deep trenches are etched and then filled by a low-temperature, liquid oxide deposition step. A photoresist mask is then formed over the field areas and the exposed portions of the oxide layer are etched. Next, a second step of liquid oxide deposition is performed, followed by another etch back step. Hence, this process uses a critical alignment step and two liquid oxide deposition and etch back steps, all of which are not easily translated to a manufacturing environment. The above-mentioned problems with respect to forming isolation regions around large active regions apply to this technique as well.

A problem common to many types of isolation processes is the difficulty in achieving a highly planarized final surface or intermediate dielectric layer. A highly planarized surface is important because it allows full utilization of the optimal resolution of modern lithography tools and thus maximizes the packing density of devices. A planar surface assists with subsequent fabrication steps by providing a uniform surface on which other materials can be deposited or on which other processes can operate. Thus, the uniform filling of trenches or spaces and the formation of a highly planar surface is important to the formation of isolation regions during the fabrication of integrated circuits.

What is desired is an isolation method which can produce a highly planar final surface and which is not susceptible to many of the problems associated with existing isolation techniques, such as the difficulty in achieving global planarity and the encroachment of isolation regions into active regions of the device.

SUMMARY OF THE INVENTION

The present invention is directed to a novel device isolation scheme that is particularly suited to the fabrication of high density, high performance CMOS, bipolar, or BiCMOS devices, and overcomes many of the problems associated with existing isolation methods.

According to a preferred embodiment of the present invention, photo-lithographic techniques are used to define active regions on a silicon substrate. Using the photoresist as a mask for the active regions, the silicon in the inactive regions is etched. A pad oxide layer and nitride layer are then formed on the substrate. A layer of oxide is then deposited and photolithographic techniques are again used to define the locations for desired trench structures. After definition of the trench locations, trenches are etched through the oxide layer down to the substrate. This is followed by the removal of the remaining photoresist and the etching of deep trenches in the silicon substrate using the deposited oxide layer as a hard mask. An oxidation step is then carried out to provide a layer of oxide lining the trenches.

Next, a layer of poly-silicon is deposited over the wafer, filling the trenches. The poly-silicon layer is then etched back anisotropically, removing it from the tops of the trenches and the field regions, but leaving a poly-silicon spacer on the sides of that portion of the previously deposited oxide layer which covers the active regions. The spacers are used to self-align a photoresist mask with the edges of the active regions, thereby allowing the etching away of the oxide layer on top of the active regions. The spacers are then removed while keeping the photoresist mask intact, thereby protecting the poly-silicon on top of the trenches. The photoresist mask is then removed and the poly-silicon on top of the trench is oxidized to cap the trench. The result is a highly planar surface in which active regions are separated by field oxide or poly-silicon filled trenches.

Accordingly, the present invention combines the formation of field oxide regions with trench isolation, where the trenches are filled with poly-silicon and oxide walled active regions are formed. The resulting structure is globally planarized with no formation of bird's beak or bird's head structures. Also, unlike the prior art, the alignment step to etch the oxide over the active regions is very non-critical due to the use of the spacers.

DETAILED DESCRIPTION OF THE PREFERRED EMBODIMENTS

Figure 1:
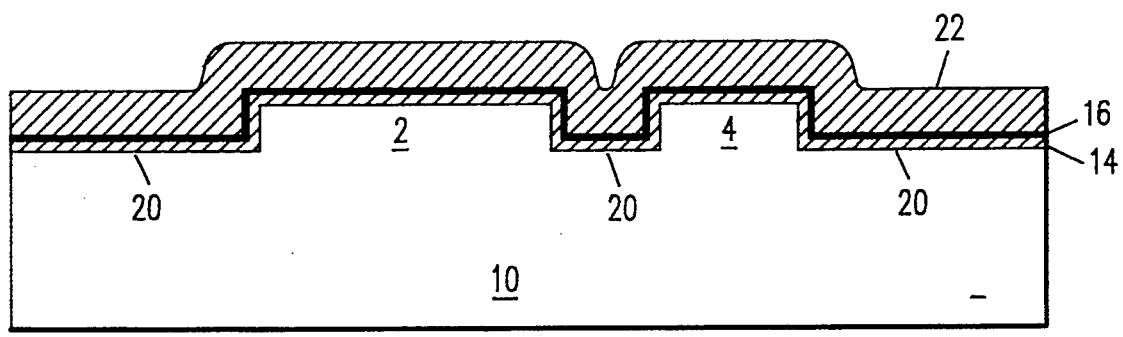
FIG. 1 illustrates a silicon substrate on which photolithography techniques have been used to define active device regions and etch the substrate in the inactive or field regions, followed by the deposition of a layer of pad oxide and a layer of nitride. These steps are followed by the deposition of a layer of LTO or TEOS oxide.

FIG. 1 shows a silicon substrate 10 on which photolithographic techniques well known in the semiconductor industry have been used to form a photoresist mask (not shown) in order to define active regions 2 and 4 on substrate 10. Substrate regions, other than active regions 2 and 4 will be referred to as inactive or field regions. Definition of active regions 2 and 4 is followed by an etch process which etches silicon substrate 10 to form shallow trenches 20, where shallow trenches 20 have a depth in the range of 0.5 to 2.0 microns. Etching of the silicon substrate may be carded out by any suitable process, for example, using $SF_6 + Cl_2$ in a reactive ion etch (RIE) process. After etching of substrate 10 and removal of the photoresist mask, a layer of pad oxide 14 is grown, followed by the deposition of a layer of silicon nitride 16. Pad oxide layer 14 has a thickness in the range of 300 to 1000 Angstroms, with a preferred thickness of 500 Angstroms. Nitride layer 16 has a thickness in the range of 1000 to 2000 Angstroms, with a preferred thickness of 1000 Angstroms and is preferably deposited by a low pressure chemical vapor deposition (LPCVD) process well known in the industry.

Following the growth of pad oxide layer 14 and deposition of nitride layer 16, a low temperature deposited oxide layer (LTO) 22, or another suitable insulator such as TEOS oxide (tetra-ethyl-ortho-silicate), is deposited over the entire substrate 10. Oxide layer 22 serves as a hard mask that will be used for the etching of deep trenches and will also be used to form the field oxide regions. The LTO oxide layer 22 is preferably deposited to a thickness of 1.2 microns, although the thickness of oxide layer 22 should be adjusted to provide the desired thickness for the final field oxide regions. For example, the thickness of the LTO oxide layer is typically made equal to the depth of the shallow trenches plus any thickness of the layer lost during the later deep trench etching step.

Figure 2:
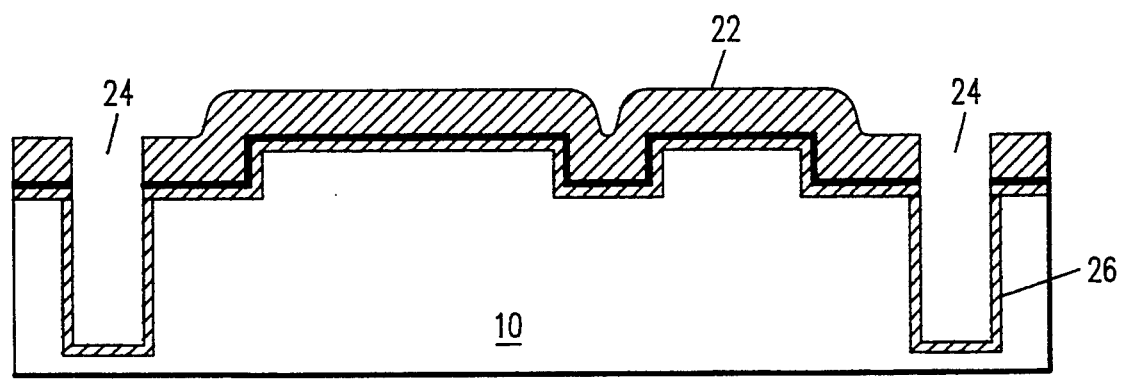
FIG. 2 illustrates the structure of FIG. 1 after a layer of LTO or TEOS oxide has been deposited and photolithographic techniques have been used to define locations for deep trenches. After removal of the photoresist layer, the LTO or TEOS oxide layer is used as a mask to allow deep trenches to be etched into the silicon substrate. This is followed by forming an oxide layer on the sidewalls of the deep trenches.

A photoresist mask (not shown) is then used to etch through oxide layer 22, nitride layer 16, and pad oxide layer 14 in order to define locations for what will become deep trench structures. After definition of the locations for the deep trenches, the photoresist layer is removed and deep trenches 24 are etched into substrate 10, using oxide layer 22 as a hard mask, as shown in FIG. 2. Deep trenches 24 are typically etched by a magnetically enhanced RIE system, although other processes such as a regular RIE or an electron-cyclotron resonance (ECR) etch process may be used. The depth of deep trenches 24 is dependent upon the application for which the isolation structures are to be used and is easily adjustable. Typically, the depth is adjusted so that the trench is sufficient to cut through the underlying junction plus the maximum depletion layer thickness. It should be noted that during the etching of trenches 24, a polymer layer is formed on top of oxide layer 22 and on the trench sidewalls. The polymer layer is subsequently removed during later stages of the etch process by optimizing the gas flows and chemistries involved in the trench etch. The polymer layer may also be removed by a wet cleaning process, such as one involving the use of an acid and/or solvent. Removal of the polymer layer is important because it enables portions of oxide layer 22 to be used as field oxide regions.

A thermal oxidation step is then performed to provide a lining oxide 26 on the inside of trenches 24 and to insulate the material used to fill trenches 24 in a later step from the rest of substrate 10. Lining oxide layer 26 is preferably 500 to 1000 Angstroms in thickness. An alternative is to deposit a thin layer of a TEOS oxide to form lining oxide 26.

Figure 3:
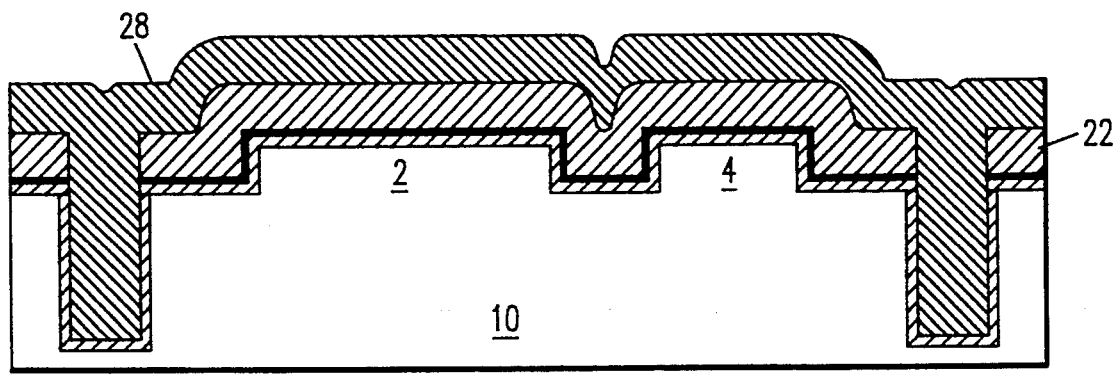
FIG. 3 illustrates the structure of FIG. 2 after deposition of a thick layer of poly-silicon over the entire substrate.

The next step is to deposit a thick (approximately 1.0 microns thick) layer of poly-silicon 28 over the surface of substrate 10, as shown in FIG. 3. Poly-silicon layer 28 fills deep trenches 24 and covers that portion of oxide layer 22 which lies over active regions 2 and 4 and shallow trenches 20. Poly-silicon is particularly suited to this application because it provides a more conformal filling material than many oxides.

Figure 4:
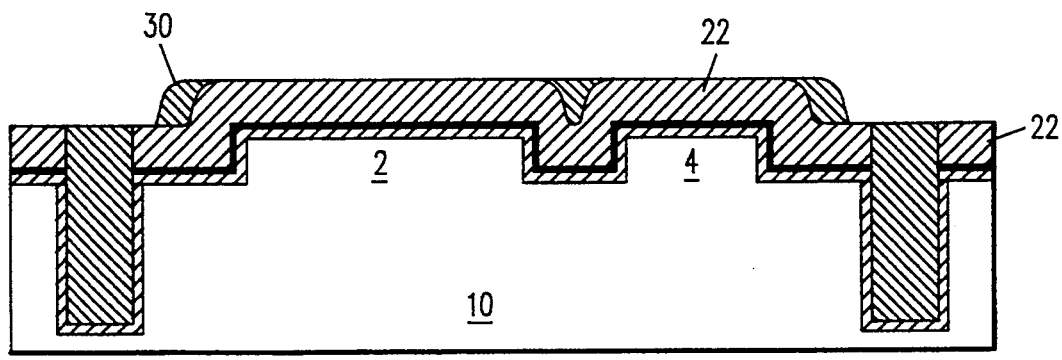
FIG. 4 illustrates the structure of FIG. 3 after the poly-silicon layer has been etched back over the trenches and field regions, planarizing the trenches and leaving behind a poly-silicon spacer on the sides of that portion of the oxide layer which covers the active regions.

The deposition of poly-silicon layer 28 is followed by a reactive ion etching (RIE) step which etches back poly-silicon layer 28 anisotropically, removing the poly-silicon over trenches 24 and the field regions. Oxide layer 22 protects active regions 2 and 4 during the poly-silicon etch step. The result is shown in FIG. 4 which illustrates the structure of FIG. 3 after poly-silicon layer 28 has been etched back over the trenches and field regions, thereby planarizing the trench regions and leaving behind poly-silicon spacers 30 on the sides of that portion of oxide layer 22 which covers active regions 2 and 4.

Figure 5:
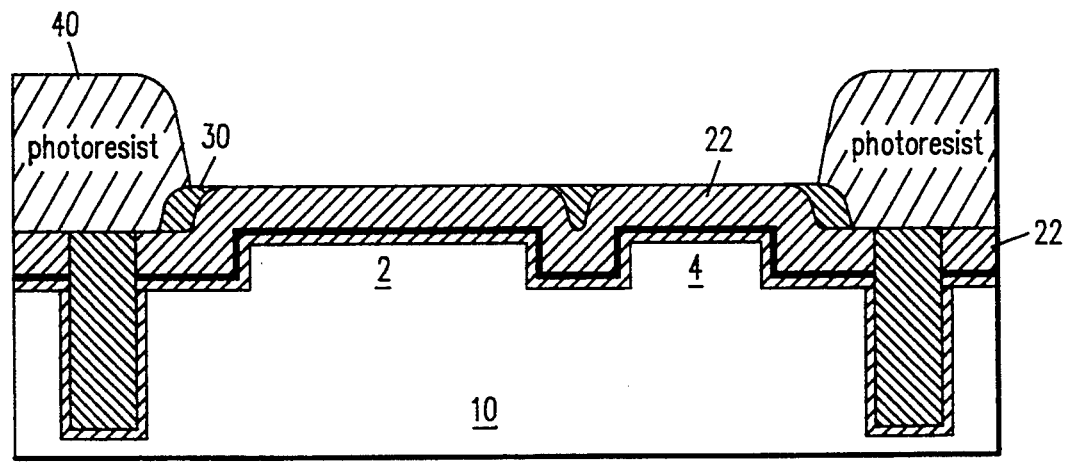
FIG. 5 illustrates the structure of FIG. 4 after the non-critical alignment of a photoresist mask on top of and within the width of the poly-silicon spacers.

Next, a photoresist mask 40 is aligned within poly-silicon spacers 30. The alignment can be accomplished by a stepper such as the ASM PAS 2500/40, manufactured by ASM Lithography. The width of spacers 30 should be enough to compensate for some misalignment of the stepper or whatever alignment tool is used. If a stepper is used, its alignment capability should be within 0.3 microns. FIG. 5 illustrates the structure of FIG. 4 after alignment of photoresist mask 40 on top of and within the width of poly-silicon spacers 30. The formation of spacers 30 makes the alignment of photoresist mask 40 very non-critical as compared to other reported processes for forming isolation regions. In addition, the use of mask 40 causes the later etching of oxide layer 22 to be a highly controllable process having a high degree of repeatability, where these attributes are independent of the size of the active regions. This means that global planarity is readily achievable, in contrast to some methods which are presently used in the industry to remove an oxide layer from on top of an active region.

Figure 6:
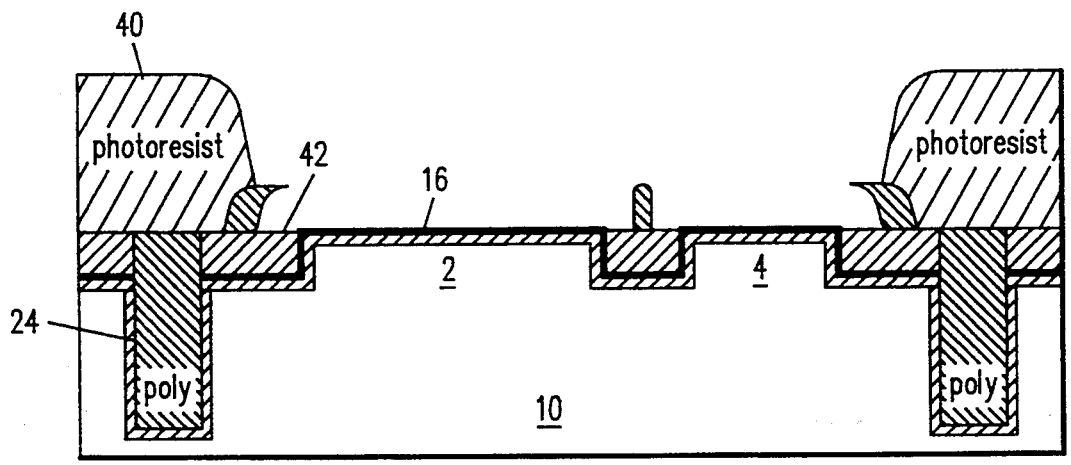
FIG. 6 illustrates the structure of FIG. 5 after removal of the oxide layer covering the active regions.

An isotropic and/or anisotropic oxide etch, which is more selective to nitride than to poly-silicon can then be used to etch away those portions of oxide layer 22 that lie over active regions 2 and 4 of substrate 10. A combination of etch processes such as RIE and plasma etches can be used if desired. The entire thickness of oxide layer 22 is etched during this step using an automatic end point detection scheme. Active regions 2 and 4 of substrate 10 are protected by nitride layer 16, while the poly-silicon in trenches 24 is protected by photoresist mask 40. Also, poly-silicon spacers 30 act as a self-aligned mask permitting the oxide next to these spacers, such as at point 42 in FIG. 6, to be etched cleanly, thereby resulting in a planar field oxide relative to the active regions. The result is shown in FIG. 6, which illustrates the structure of FIG. 5 after removal of that portion of oxide layer 22 which covers active regions 2 and 4.

Figure 7:
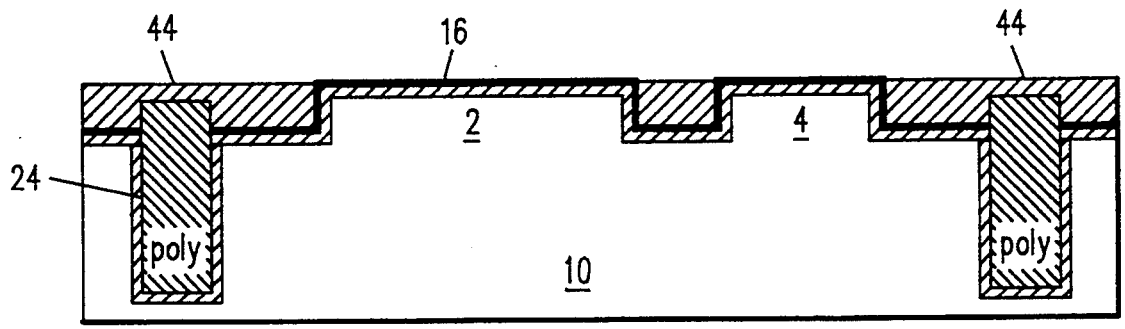
FIG. 7 illustrates the structure of FIG. 6 after removal of the remaining portions of the poly-silicon spacers by a selective etching process which leaves the photoresist mask intact. This is followed by removal of the photoresist mask and oxidation of the poly-silicon on top of the trenches to cap the trenches.

Next a wet etch process or isotropic plasma etch which is selective to nitride is used to remove the remaining poly-silicon spacers 30 while leaving photoresist mask 40 intact. The wet etch may be one based on using a potassium hydroxide solution (KOH), while the plasma etch is preferably a low power, $SF_6$ isotropic plasma etch process. Again, photoresist mask 40 serves to protect the poly-silicon filling deep trenches 24. Photoresist mask 40 is then removed, followed by oxidation of that portion of poly-silicon layer 28 on top of deep trenches 24 in order to form an oxide cap 44. Nitride layer 16 protects active regions 2 and 4 during these steps of the process. The resulting structure is shown in FIG. 7.

Figure 8:
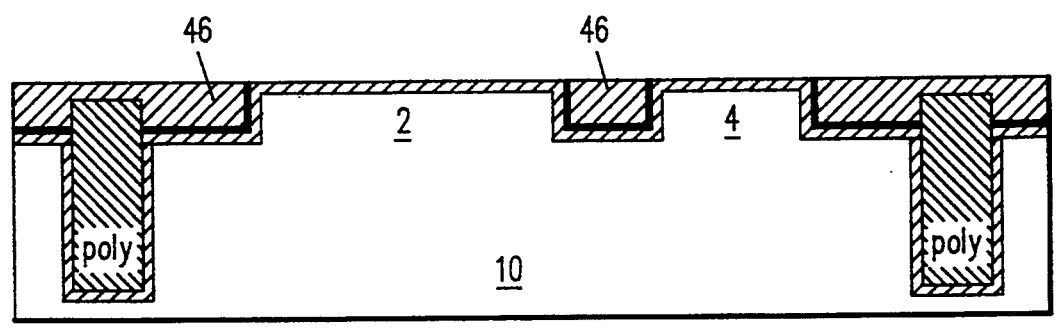
FIG. 8 illustrates the structure of FIG. 7 after the nitride layer has been stripped off to prepare the substrate for further processing.

Finally, nitride layer 16 can be stripped off using well known plasma or hot phosphoric etching techniques so that subsequent processing of substrate 10 can be continued with the structure shown in FIG. 8. As indicated by the figure, the result of the previous processing steps is to form active regions 2 and 4 surrounded by highly planar field oxide regions 46 and poly-silicon filled deep trench isolation structures.

In accordance with the present invention, the result of the described processing steps is to produce a highly planar field oxide structure with fully-walled active regions. The use of poly-silicon to fill deep trenches 24 conformally means that no additional planarization step is needed, while the lining oxide 26 serves to insulate the rest of substrate 10 from the poly-silicon. The number of deposition steps is minimized since only one LTO and one poly-silicon deposition step are required.

The described process of forming isolation regions is quite efficient as several of the process steps perform more than one function. As an example, the same oxide layer 22 used to form the mask for the definition of deep trenches 24 is also used to form the field oxide layer. In addition, poly-silicon layer 28 which is used to fill deep trenches 24 is also used to form spacers 30 which serve to align photoresist mask 40 and allow removal of the oxide layer from the active regions.

An important feature of the present invention is that, unlike the prior art, the masking step required to etch oxide on top of the active areas is very non-critical, i.e., less sensitive to alignment between the photoresist mask and the oxide layer due to the presence of the poly-silicon spacers. Also, the number of thermal steps is minimized so that a long thermal cycle is not needed. In particular, the long thermal cycle involved in the formation of field oxide by thermal oxidation is avoided.

An additional embodiment of the present invention is one in which the process steps are used without the formation of the deep trenches to form isolation regions consisting of a highly planar field oxide. In such a process the oxide layer deposition step is followed by a poly-silicon deposition step. The poly-silicon is then etched, again providing a spacer for the non-critical alignment of a mask which is used to remove the oxide layer from the active regions of the device.

This additional embodiment is particularly suited to the fabrication of low voltage CMOS, bipolar, or BiCMOS devices. It may also be used in conjunction with junction isolation techniques for the fabrication of high voltage bipolar or BiCMOS devices.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed.

We claim:

1. A method for electrically isolating individual active device regions of an integrated circuit fabricated in a semiconductor substrate, the method comprising:
   defining active and inactive regions on the substrate;
   etching the substrate in the inactive regions to form an etched portion of the substrate;
   depositing a layer of pad oxide on the resulting substrate;
   depositing a layer of nitride on the pad oxide layer;
   depositing a first oxide layer over the substrate, wherein the first oxide layer covers the previously deposited pad oxide and nitride layers and forms a step as a result of the etching step;
   patterning the first oxide layer to serve as a mask to define one or more deep trenches in the inactive regions of the substrate;
   etching one or more of the previously defined deep trenches into the silicon substrate;
   forming a second oxide layer on a wall or walls of the deep trenches;
   depositing a layer of poly-silicon over the substrate, wherein the poly-silicon fills the deep trenches and covers the first oxide layer;
   etching the poly-silicon layer to remove the poly-silicon from the inactive regions and to form a poly-silicon spacer on the sides of the step; and
   aligning a mask over the etched portions of the substrate and having an edge over the poly-silicon spacer such that a portion of the first oxide layer overlying the active regions is exposed.

2. The method of claim 1, further comprising:
   removing the first oxide layer from the active regions;
   removing the poly-silicon spacer;
   removing the remaining portions of the mask previously aligned over the etched portions of the substrate; and
   oxidizing the poly-silicon on top of the deep trenches.

3. The method of claim 1, wherein the poly-silicon spacer is laterally displaced from the active regions by a distance approximately equal to the thickness of the first oxide layer.

4. The method of claim 2, wherein the spacers act as a self-aligned mask permitting a portion of the oxide layer lying next to the spacers to be etched to form a planar field oxide relative to the active regions.

5. The method of claim 1, wherein the first oxide layer is low temperature deposited oxide (LTO).

6. The method of claim 1, wherein the first oxide layer is tetra-ethyl-ortho-silicate (TEOS) oxide.

7. The method of claim 1, wherein the deep trench is etched by a reactive ion etching (RIE) process.

8. The method of claim 1, wherein the deep trench is etched by a magnetically enhanced reactive ion etching (RIE) process.

9. The method of claim 1, wherein the deep trench is etched by an electron-cyclotron resonance etch process.

10. The method of claim 1, wherein the poly-silicon is etched by a reactive ion etching (RIE) process.

11. The method of claim 1, wherein the poly-silicon is etched by a magnetically enhanced reactive ion etching (RIE) process.

12. The method of claim 1, wherein the poly-silicon is etched by an electron-cyclotron resonance etch process.

13. A method for electrically isolating individual active device regions of an integrated circuit fabricated in a semiconductor substrate, the method comprising:
    defining active and inactive regions on the substrate;
    etching the substrate in the inactive regions to form an etched portion of the substrate;
    depositing a layer of pad oxide on the resulting substrate;
    depositing a layer of nitride on the pad oxide layer;
    depositing a first oxide layer over the substrate, wherein the first oxide layer covers the previously deposited pad oxide and nitride layers and forms a step as a result of the etching step;
    depositing a layer of poly-silicon over the substrate, wherein the poly-silicon covers the first oxide layer;
    etching the poly-silicon layer to remove the poly-silicon from the inactive regions and to form a poly-silicon spacer on the sides of the step; and
    aligning a mask over the etched portions of the substrate and having an edge over the poly-silicon spacer such that a portion of the first oxide layer overlying the active regions is exposed.

14. The method of claim 13, further comprising:
    removing the first oxide layer from the active regions;
    removing the poly-silicon spacer; and
    removing the remaining portions of the mask previously aligned over the etched portions of the substrate.

15. The method of claim 13, wherein the poly-silicon spacer is laterally displaced from the active regions by a distance approximately equal to the thickness of the first oxide layer.

16. The method of claim 14, wherein the spacers act as a self-aligned mask permitting a portion of the first oxide layer lying next to the spacers to be etched to form a planar field oxide relative to the active regions.

17. The method of claim 13, wherein the first oxide layer is low temperature deposited oxide (LTO).

18. The method of claim 13, wherein the first oxide layer is tetra-ethyl-ortho-silicate (TEOS) oxide.

19. The method of claim 13, wherein the poly-silicon is etched by a reactive ion etching (RIE) process.

20. The method of claim 13, wherein the poly-silicon is etched by a magnetically enhanced reactive ion etching (RIE) process.

21. The method of claim 13, wherein the poly-silicon is etched by an electron-cyclotron resonance etch process.

* * * * *